US010262578B2

(12) United States Patent
Tamura et al.

(10) Patent No.: US 10,262,578 B2
(45) Date of Patent: Apr. 16, 2019

(54) POWER SUPPLY CIRCUIT, CIRCUIT DEVICE, DISPLAY DEVICE, AND ELECTRONIC APPARATUS

(71) Applicant: SEIKO EPSON CORPORATION, Tokyo (JP)

(72) Inventors: Tsuyoshi Tamura, Hara-mura (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 177 days.

(21) Appl. No.: 15/611,158

(22) Filed: Jun. 1, 2017

(65) Prior Publication Data
US 2017/0372652 A1 Dec. 28, 2017

(30) Foreign Application Priority Data

Jun. 22, 2016 (JP) ................................. 2016-123369

(51) Int. Cl.
*G06F 3/038* (2013.01)
*G09G 3/20* (2006.01)
*H03K 19/0175* (2006.01)

(52) U.S. Cl.
CPC ... *G09G 3/2092* (2013.01); *H03K 19/017509* (2013.01); *G09G 2310/0289* (2013.01); *G09G 2330/02* (2013.01); *G09G 2330/028* (2013.01)

(58) Field of Classification Search
CPC ......... G09G 3/2092; G09G 2310/0289; G09G 2330/02; H03K 19/017509
See application file for complete search history.

(56) References Cited

U.S. PATENT DOCUMENTS

| 2002/0003449 | A1 | 1/2002 | Kato |
| 2002/0011883 | A1 | 1/2002 | Yamazaki et al. |
| 2002/0047741 | A1 | 4/2002 | Kato et al. |
| 2003/0098712 | A1 | 5/2003 | Kihara et al. |
| 2006/0208777 | A1 | 9/2006 | Ichikawa et al. |
| 2009/0058194 | A1* | 3/2009 | Lee ..................... G09G 3/3685 307/130 |
| 2009/0243697 | A1 | 10/2009 | Funakoshi |

(Continued)

FOREIGN PATENT DOCUMENTS

JP H09-331174 A 12/1997
JP 2002-026260 A 1/2002

(Continued)

*Primary Examiner* — Nelson M Rosario
*Assistant Examiner* — Andrew Lee
(74) *Attorney, Agent, or Firm* — Oliff PLC

(57) ABSTRACT

A power supply circuit includes: a regulator configured to receive a first power supply voltage and a third power supply voltage higher than the first power supply voltage and output a regulated voltage between the first power supply voltage and the third power supply voltage based on the third power supply voltage; and an output control circuit configured to select the first power supply voltage or the regulated voltage to output as a second power supply voltage. The output control circuit outputs the first power supply voltage as the second power supply voltage when the third power supply voltage is lower than a threshold voltage, whereas the output control circuit outputs the regulated voltage as the second power supply voltage when the third power supply voltage is higher than or equal to the threshold voltage.

18 Claims, 8 Drawing Sheets

(56) References Cited

U.S. PATENT DOCUMENTS

| | | | |
|---|---|---|---|
| 2013/0307504 A1 | 11/2013 | Sato | |
| 2016/0189624 A1* | 6/2016 | Jang | G09G 3/3258 345/213 |
| 2017/0243558 A1* | 8/2017 | Yamamoto | G09G 3/3677 |

FOREIGN PATENT DOCUMENTS

| | | |
|---|---|---|
| JP | 2002-042459 A | 2/2002 |
| JP | 2002-134695 A | 5/2002 |
| JP | 2003-163590 A | 6/2003 |
| JP | 2006-262180 A | 9/2006 |
| JP | 2008-153733 A | 7/2008 |
| JP | 2012-143030 A | 7/2012 |
| JP | 2013-106063 A | 5/2013 |
| JP | 2013-242938 A | 12/2013 |
| WO | 2008-072280 A1 | 6/2008 |

* cited by examiner

POWER SUPPLY CIRCUIT, CIRCUIT DEVICE, DISPLAY DEVICE, AND ELECTRONIC APPARATUS

BACKGROUND

1. Technical Field

The present invention relates to a power supply circuit, a circuit device, a display device, an electronic apparatus, and the like.

2. Related Art

JP-A-2013-242938 describes an integrated circuit including a plurality of internal power supplies. In the integrated circuit described in JP-A-2013-242938, the maximum number of voltage step-up circuits that output voltages is limited so that the output voltages are prevented from fluctuating at undesirable potentials.

If, when electric power is externally supplied to an integrated circuit configured to operate by using a plurality of power supplies, a higher power supply voltage with an input being undefined is applied to a level shifter circuit, or the like in the integrated circuit, a through current may flow through the circuit. At this time, if an external power supply capacity does not suffice, the voltage may no longer rise, or the IC may be broken due to heat generation by a high voltage and/or a large current. Therefore, to the integrated circuit configured to operate by using a plurality of power supplies, voltages have to be supplied sequentially from a low voltage so as to avoid a voltage inversion. This also applies to a case of three or more power supplies. However, in the above-described integrated circuit of JP-A-2013-242938, in some cases, the order of high-and-low levels may be inverted when the power supplies are turned on. Moreover, when the number of power supplies which externally supply electric power increases, creation of external power supplies and control of the sequence of the external power supplies are required. This may lead to an increased number of external components.

For example, when a low power supply voltage, a high power supply voltage, and an intermediate power supply voltage are applied to an integrated circuit, in many cases, the low power supply voltage is used to drive a control logic which receives an input signal, and the high power supply voltage is used to control a display part and/or an external apparatus. Moreover, in many cases, the intermediate power supply voltage is used by a power supply of an analog sensor and/or is used to perform a level shift for converting the input signal into an output signal.

Here, when an intermediate power supply is created from a logic control power supply, a boost capacitor may be required outside, and/or control of waiting for a voltage to rise may be required.

Note that when, for example, a regulator is incorporated in the integrated circuit, an intermediate power supply voltage can be generated in the integrated circuit from the highest power supply voltage. However, such a configuration cannot maintain the order in which the power supplies are turned on as described above. That is, after a logic power supply, a high power supply voltage is applied, and thereafter, the intermediate power supply voltage is applied, which makes it no longer possible to apply power supply voltages sequentially from a low voltage to the integrated circuit.

SUMMARY

An advantage of some aspects of the invention is that it is possible to provide a power supply circuit, a circuit device, a display device, an electronic apparatus, and the like which enable suppression of flow of a through current when a power supply is turned on.

One aspect of the invention relates to a power supply circuit including: a regulator configured to receive a first power supply voltage and a third power supply voltage higher than the first power supply voltage and output a regulated voltage between the first power supply voltage and the third power supply voltage based on the third power supply voltage; and an output control circuit configured to select the first power supply voltage or the regulated voltage to output as a second power supply voltage, wherein the output control circuit outputs the first power supply voltage as the second power supply voltage when the third power supply voltage is lower than a threshold voltage, whereas the output control circuit outputs the regulated voltage as the second power supply voltage when the third power supply voltage is higher than or equal to the threshold voltage.

According to the one aspect of the invention, the first power supply voltage is output as the second power supply voltage when the third power supply voltage is lower than the threshold voltage, whereas the regulated voltage is output as the second power supply voltage when the third power supply voltage is higher than or equal to the threshold voltage. Thus, it is possible to suppress flow of a through current when a power supply is turned on.

Moreover, in the one aspect of the invention, the threshold voltage may be a voltage between the regulated voltage and the third power supply voltage.

This configuration enables, for example, generation of the regulated voltage from the third power supply voltage higher than the regulated voltage, for example, when the third power supply voltage equals or exceeds the threshold voltage.

Moreover, in the one aspect of the invention, the output control circuit includes: a determination circuit configured to determine whether or not the third power supply voltage is higher than or equal to the threshold voltage; and a selector configured to output the second power supply voltage, and the selector may output the first power supply voltage as the second power supply voltage when the determination circuit determines that the third power supply voltage is lower than the threshold voltage, whereas the selector may output the regulated voltage as the second power supply voltage when the determination circuit determines that the third power supply voltage is higher than the threshold voltage.

This configuration enables, for example, an operation of determining the relationship regarding the magnitude between the third power supply voltage and the threshold voltage and an operation of selecting the second power supply voltage.

Moreover, in the one aspect of the invention, the determination circuit may include a comparator configured to compare a divided voltage obtained by dividing the third power supply voltage with the first power supply voltage.

This configuration enables, for example, determination of whether or not the third power supply voltage equals or exceeds the threshold voltage.

Moreover, in the one aspect of the invention, the selector may include: a PMOS transistor disposed between a node of the first power supply voltage and a node of the second power supply voltage; and an NMOS transistor disposed between an output node of the regulator and the node of the second power supply voltage.

This configuration enables, for example, switching of a voltage output as the second power supply voltage between the first power supply voltage and the regulated voltage.

Moreover, in the one aspect of the invention, the regulator may include: an operational amplifier including a first input terminal, a second input terminal, and an output terminal; a first resistor disposed between the second input terminal and the output terminal; and a second resistor disposed between the first resistor and a node of a fourth power supply voltage lower than the first power supply voltage, wherein the operational amplifier may be supplied with the third power supply voltage, a voltage obtained by dividing the regulated voltage by the first resistor and the second resistor may be input to the second input terminal, the first power supply voltage may be input to the first input terminal, and the operational amplifier may output the regulated voltage from the output terminal.

This configuration enables, for example, generation of the regulated voltage, which is a voltage suitable for driving an external circuit, from the third power supply voltage.

Moreover, in the one aspect of the invention, the second power supply voltage may be a power supply voltage supplied to a first level shifter configured to perform a level shift of an input signal based on the first power supply voltage, and the third power supply voltage may be a power supply voltage supplied to a second level shifter configured to perform a level shift of an output signal from the first level shifter.

This configuration enables, for example, performing, based on the second power supply voltage supplied from the power supply circuit, a two-stage level shift of the input signal based on the first power supply voltage. Moreover, even when such a level shifter is provided, the one aspect of the invention can prevent flow of a through current through the level shifter when a power supply is turned on.

Moreover, in the one aspect of the invention, the first level shifter and the second level shifter may be level shifters each configured to perform a level shift of each of a plurality of signals used in a drive circuit configured to drive a data line or a scanning line of an electro-optical panel.

This configuration enables, for example, generation of a display signal to, for example, an electro-optical panel. Even in a case of a circuit requiring a plurality of power supplies such as a drive circuit of an electro-optical panel, the one aspect of the invention can prevent flow of a through current through the circuit when a power supply is turned on.

Another aspect of the invention relates to a circuit device including: the power supply circuit; a first level shifter to which the second power supply voltage is supplied and which is configured to perform a level shift of an input signal based on the first power supply voltage; and a second level shifter to which the third power supply voltage is supplied and which is configured to perform a level shift of an output signal from the first level shifter.

Still another aspect of the invention relates to a display device including: the circuit device; and an electro-optical panel.

Yet another aspect of the invention relates to an electronic apparatus including the power supply circuit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will be described below. It should be noted that the embodiments described hereinafter are not intended to limit the content of the invention described in the claims. All the configurations described in the embodiments are not necessarily essential components of the invention.

1. Power Supply Circuit

Figure 1:
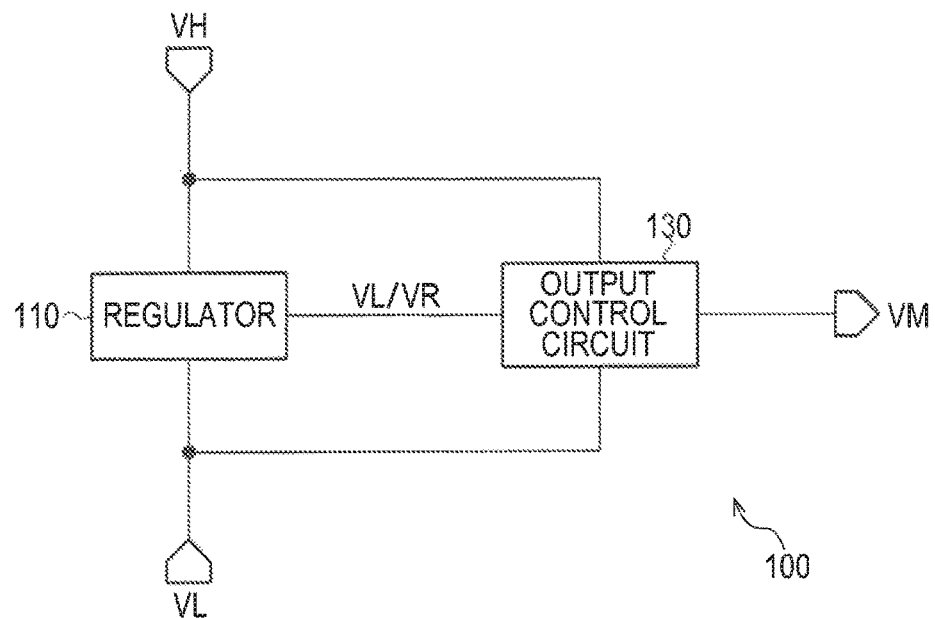
FIG. 1 is a circuit diagram illustrating a power supply circuit of the present embodiment.

A circuit diagram of a power supply circuit 100 of the present embodiment is shown in FIG. 1. As illustrated in FIG. 1, the power supply circuit 100 of the present embodiment includes a regulator 110 and an output control circuit 130. The regulator 110 receives a first power supply voltage VL and a third power supply voltage VH higher than the first power supply voltage VL. The regulator 110 outputs a regulated voltage VR between the first power supply voltage VL and the third power supply voltage VH based on the third power supply voltage VH. The output control circuit 130 selects the first power supply voltage VL or the regulated voltage VR to output as a second power supply voltage VM.

Figure 5:
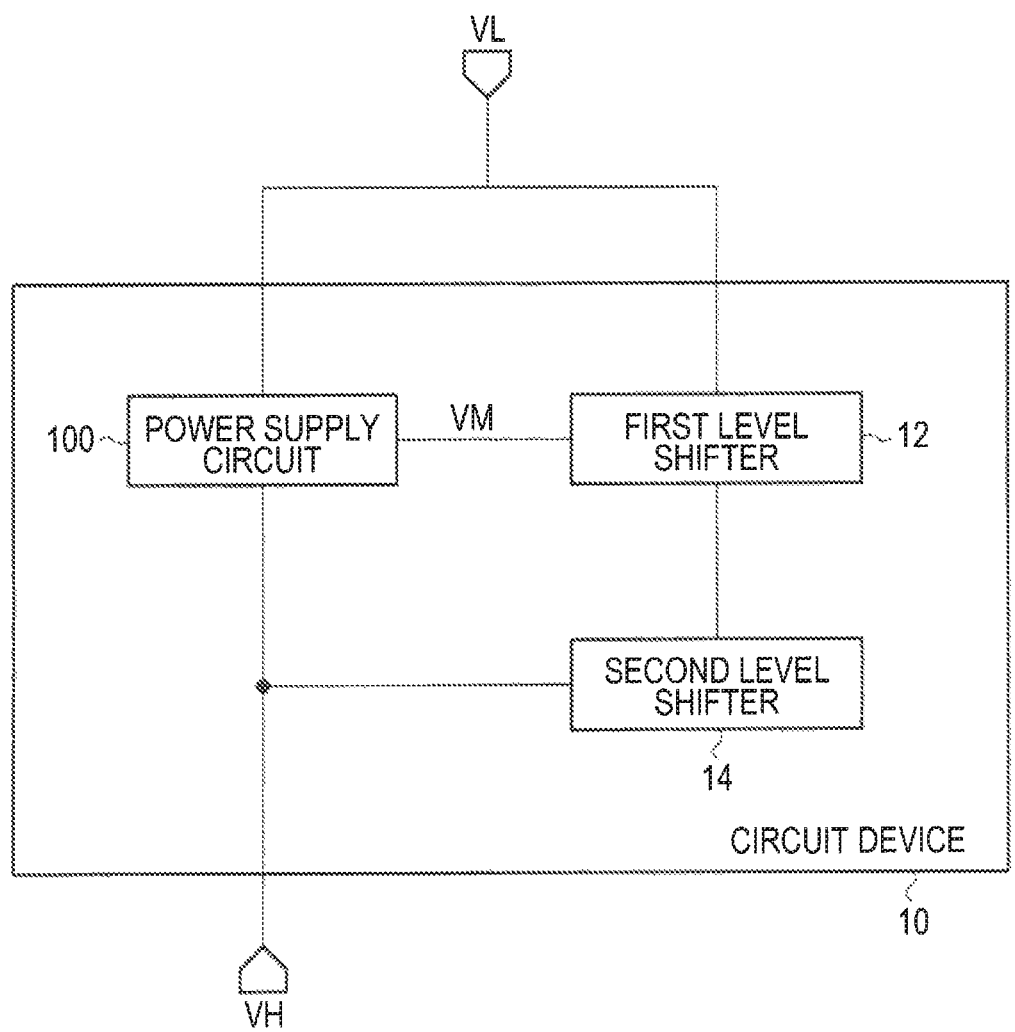
FIG. 5 is a circuit diagram illustrating a circuit device of the present embodiment.

For example, as illustrated in FIG. 5, which will be described later, the power supply circuit 100 is connected to an external circuit, for example, a level shifter circuit (a first level shifter 12 in FIG. 5) outside the power supply circuit 100 and outputs the second power supply voltage VM to the external circuit of the power supply circuit 100. As described above, in a case where a high voltage is applied to a circuit (a second level shifter 14 in FIG. 5) located downstream of the external circuit before the power supply circuit 100 supplies the second power supply voltage VM to the external circuit, a through current flows through the external circuit, which may cause damage to, for example, a circuit element. Note that the configuration of the level shifter of the present embodiment and an example of application of a high voltage to the level shifter will be described in detail later.

To address this problem, as described above, the output control circuit 130 selects the first power supply voltage VL or the regulated voltage VR to output as the second power supply voltage VM.

Figure 2:
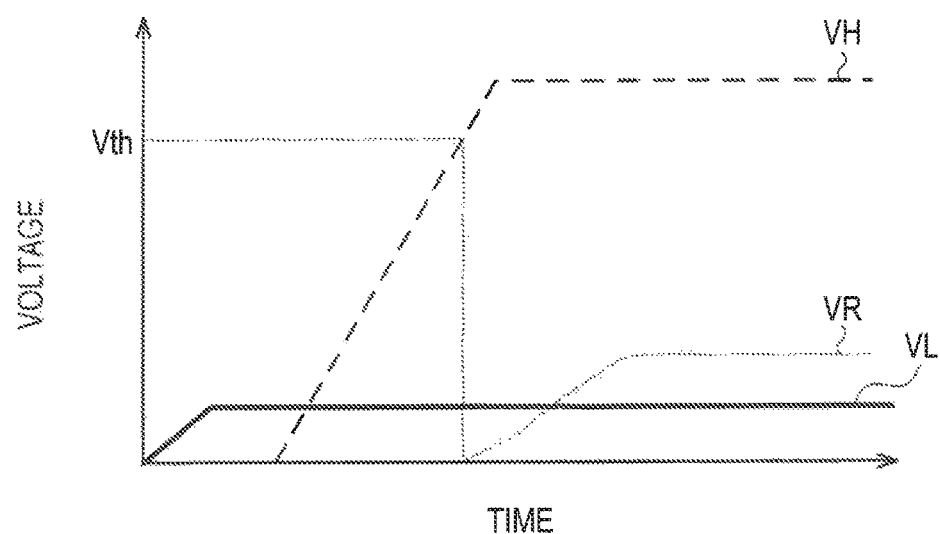
FIG. 2 is a graph illustrating a first power supply voltage, a third power supply voltage, and a regulated voltage over time.

As a specific example, for example, FIG. 2 shows a graph in which the first power supply voltage VL, the third power supply voltage VH, and the regulated voltage VR are plotted, where the vertical axis represents voltages, and the horizontal axis represents time. As illustrated in the graph of FIG. 2, in the present embodiment, the third power supply voltage VH is applied after the first power supply voltage VL is applied. Then, the third power supply voltage VH rises, and when the third power supply voltage VH increases to or exceeds a prescribed threshold voltage Vth, the regulated voltage VR also rises.

Here, as illustrated in FIG. 2, the output control circuit 130 outputs the first power supply voltage VL as the second power supply voltage VM when the third power supply voltage VH is lower than the threshold voltage Vth, whereas the output control circuit 130 outputs the regulated voltage VR as the second power supply voltage VM when the third power supply voltage VH is higher than or equal to the threshold voltage Vth.

In this way, in the present embodiment, the third power supply voltage VH is supplied to the power supply circuit 100 after the first power supply voltage VL is supplied, but the first power supply voltage VL is output as the second power supply voltage VM until the regulated voltage VR rises. Therefore, until the regulated voltage VR is generated from the third power supply voltage, all circuits outside the power supply circuit 100 can be supplied with electric power, and an undefined state can be avoided. Thus, it is possible to suppress flow of a through current when a power supply is turned on. Moreover, when the regulated voltage VR reaches the prescribed voltage, the regulated voltage VR can be output as the second power supply voltage.

Here, the threshold voltage Vth is a voltage between the regulated voltage VR and the third power supply voltage VH. That is, VR<Vth<VH, and, for example, VR=3.3 V, VH=8 V, and Vth=6.9 V.

This configuration enables, for example, generation of the regulated voltage VR from the third power supply voltage VH higher than the regulated voltage VR, for example, when the third power supply voltage VH equals or exceeds the threshold voltage Vth.

Figure 3:
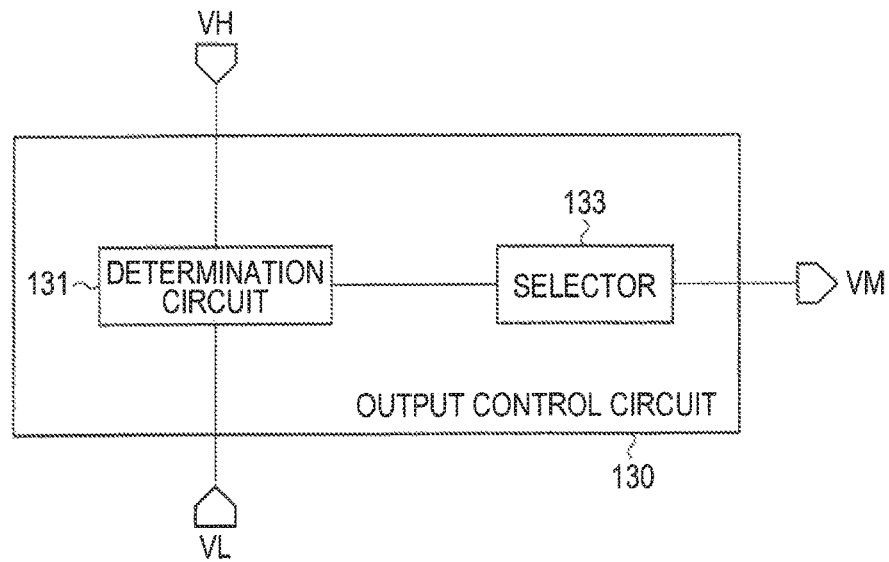
FIG. 3 is a circuit diagram illustrating an output control circuit.

Next, a specific configuration example of the output control circuit 130 is shown in FIG. 3. As illustrated in FIG. 3, the output control circuit 130 includes a determination circuit 131 and a selector 133. The determination circuit 131 determines whether or not the third power supply voltage VH is higher than the threshold voltage Vth. The selector 133 outputs the first power supply voltage VL as the second power supply voltage VM when the determination circuit 131 determines that the third power supply voltage VH is lower than the threshold voltage Vth, whereas the selector 133 outputs the regulated voltage VR as the second power supply voltage VM when the determination circuit 131 determines that the third power supply voltage VH is higher than the threshold voltage Vth.

This configuration enables, for example, an operation of determining the relationship regarding the magnitude between the third power supply voltage VH and the threshold voltage Vth and an operation of selecting the second power supply voltage VM.

Figure 4:
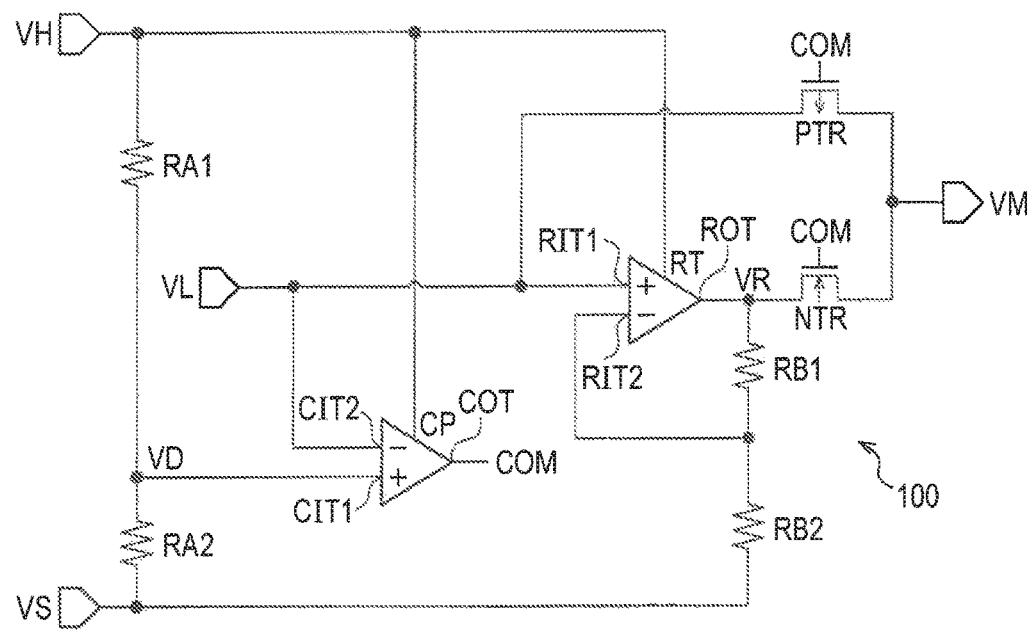
FIG. 4 is a circuit diagram illustrating the power supply circuit in detail.

Here, a more specific circuit configuration is shown in FIG. 4. As illustrated in FIG. 4, the power supply circuit 100 includes a resistor RA1, a resistor RA2, a comparator CP, an operational amplifier RT, a resistor RB1, a resistor RB2, a PMOS transistor PTR, and an NMOS transistor NTR.

For example, in the example of FIG. 4, the determination circuit 131 of FIG. 3 which was previously described includes the comparator CP configured to compare a divided voltage VD obtained by dividing the third power supply voltage VH with the first power supply voltage VL.

The comparator CP includes a first input terminal CIT1, a second input terminal CIT2, and an output terminal COT and is supplied with the third power supply voltage VH as a drive voltage. Moreover, the first input terminal CIT1 of the comparator CP receives the divided voltage VD obtained by dividing the third power supply voltage VH by the resistor RA1 and the resistor RA2, and the second input terminal CIT2 receives the first power supply voltage VL. Then, the comparator CP outputs an output voltage COM from the output terminal COT. Specifically, when the divided voltage VD is higher than the first power supply voltage VL, a high-level voltage is output as the output voltage, whereas when the divided voltage VD is lower than the first power supply voltage VL, a low-level voltage is output as the output voltage. The output voltage COM is supplied to the PMOS transistor PTR and the NMOS transistor NTR.

That is, in the present embodiment, as previously described, whether or not the third power supply voltage VH equals or exceeds the threshold voltage Vth is determined based on whether or not the divided voltage VD equals or exceeds the first power supply voltage VL. Therefore, the resistance value of the resistor RA1 and the resistance value of the resistor RA2 are predetermined such that the divided voltage VD equals the first power supply voltage VL when the third power supply voltage VH equals the threshold voltage Vth.

This configuration enables, for example, determination of whether or not the third power supply voltage VH equals or exceeds the threshold voltage Vth.

Moreover, in the example of FIG. 4, the selector 133 of FIG. 3 which was previously described includes the PMOS transistor PTR and the NMOS transistor NTR. The PMOS transistor PTR is disposed between a node of the first power supply voltage VL and a node of the second power supply voltage VM. The NMOS transistor NTR is disposed between an output node of the regulator 110 and the node of the second power supply voltage VM.

Then, the PMOS transistor PTR is ON when the output voltage COM from the comparator CP is at a low level, and the PMOS transistor PTR outputs the first power supply voltage VL as the second power supply voltage VM. Moreover, the PMOS transistor PTR is OFF when the output voltage COM from the comparator CP is at a high level.

On the other hand, the NMOS transistor NTR is ON when the output voltage COM from the comparator CP is at the high level, and the NMOS transistor NTR outputs the regulated voltage VR as the second power supply voltage VM. Moreover, the NMOS transistor NTR is OFF when the output voltage COM from the comparator CP is at the low level.

That is, summarizing the above, when the divided voltage VD is lower than the first power supply voltage VL, the output voltage COM at the low level is output from the comparator CP. Then, the PMOS transistor PTR is turned ON, and the first power supply voltage VL is output as the second power supply voltage VM. At this time, the NMOS transistor NTR is in an OFF state.

On the other hand, when the divided voltage VD is higher than the first power supply voltage VL, the output voltage COM at the high level is output from the comparator CP. Then, the NMOS transistor NTR is turned ON, and the regulated voltage VR is output as the second power supply voltage VM. At this time, the PMOS transistor PTR is in an OFF state.

This enables, for example, switching of a voltage output as the second power supply voltage VM between the first power supply voltage VL and the regulated voltage VR. Note that the configuration of the selector 133 is not limited to the configuration of FIG. 4, and instead of the PMOS transistor PTR and the NMOS transistor NTR, other analog switches may be used.

Moreover, in the example of FIG. 4, the regulator 110 of FIG. 1 which was previously described includes the operational amplifier RT, the first resistor RB1, and the second resistor RB2. The operational amplifier RT includes a first input terminal RIT1, a second input terminal RIT2, and an output terminal ROT. The first resistor RB1 is disposed between the second input terminal RIT2 and the output terminal ROT. The second resistor RB2 is disposed between the first resistor RB1 and a node of a fourth power supply voltage VS lower than the first power supply voltage VL.

The operational amplifier RT is supplied with the third power supply voltage VH as a drive voltage. Moreover, a voltage obtained by dividing the regulated voltage VR by the first resistor RB1 and the second resistor RB2 is input to the second input terminal RIT2, and the first power supply voltage VL is input to the first input terminal RIT1. Then, the operational amplifier RT outputs the regulated voltage VR from the output terminal ROT.

This configuration enables, for example, generation of the regulated voltage VR, which is a voltage suitable for driving an external circuit, from the third power supply voltage VH.

This configuration can eliminate the need for, for example, external generation of an intermediate power supply voltage (the second power supply voltage VM) or controlling the sequence in which power supplies are turned on.

2. Circuit Device

Here, an example of a circuit device including the power supply circuit 100 of the present embodiment is shown in FIG. 5. A circuit device 10 of FIG. 5 includes the power supply circuit 100, the first level shifter 12, and the second level shifter 14.

To the first level shifter 12, the second power supply voltage VM is supplied from the power supply circuit 100, and the first power supply voltage VL is also supplied externally. The first level shifter 12 performs, based on the second power supply voltage VM, a level shift of an input signal based on the first power supply voltage VL to output an output signal to the second level shifter 14. The second power supply voltage VM is a power supply voltage which is supplied to the first level shifter 12.

The output signal from the first level shifter 12 and the third power supply voltage VH are supplied to the second level shifter 14. The second level shifter 14 performs, based on the third power supply voltage VH, a level shift of the output signal supplied from the first level shifter 12. The third power supply voltage VH is a power supply voltage which is supplied to the second level shifter 14.

This configuration enables, for example, performing, based on the second power supply voltage VM supplied from the power supply circuit 100, a two-stage level shift of the input signal based on the first power supply voltage VL. That is, since the first power supply voltage VL is given to the first level shifter, the output of the first level shifter is defined by the input state of the first power supply voltage VL, and since the output signal of the first level shifter is given to the second level shifter, the output of the second level shifter is defined. Therefore, it is possible to prevent flow of the through current.

Moreover, the first level shifter 12 and the second level shifter 14 are level shifters each configured to perform a level shift of each of a plurality of signals used in a drive circuit configured to drive a data line or a scanning line of an electro-optical panel 200.

This configuration enables, for example, generation of a display signal to, for example, the electro-optical panel 200 (display unit) shown in FIG. 6, which will be described later.

Figure 6:
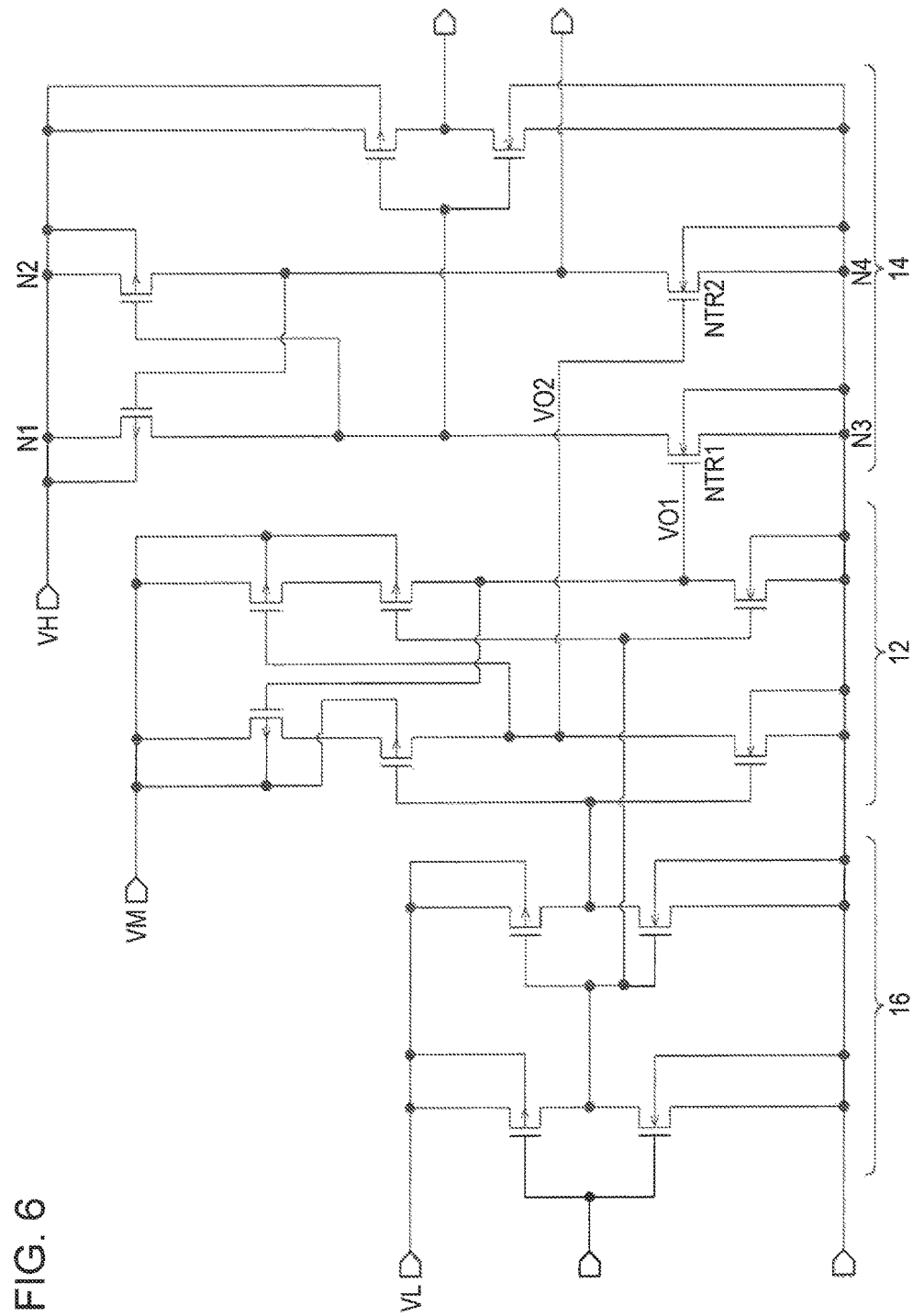
FIG. 6 is a circuit diagram illustrating a shift register in detail.

Here, in the circuit device of the present embodiment, for example, a level shifter as shown in FIG. 6 is used. The circuit device shown in FIG. 6 includes the first level shifter 12 and the second level shifter 14 as shown in FIG. 5 and an inverter circuit 16 which is not shown in FIG. 5. The inverter circuit 16 is supplied with the first power supply voltage VL from the outside of the circuit device, performs a level shift, and outputs an output voltage to the first level shifter 12. The first level shifter 12 is supplied with the second power supply voltage VM from the power supply circuit 100 and the output voltage from the inverter circuit 16, performs a level shift, and outputs output voltages (VO1, VO2) to the second level shifter 14. In a similar manner, the second level shifter 14 is supplied with the third power supply voltage VH from the outside of the power supply circuit and the output voltages (VO1, VO2) from the first level shifter 12, and performs a level shift.

If, when such a level shifter is used, the third power supply voltage VH is supplied to the second level shifter 14 before the second power supply voltage VM is generated as previously described, the output voltages (VO1, VO2) of the first level shifter 12 may have undefined values. As a result, the undefined values are input to the gates of NMOS transistors (NTR1, NTR2) of the second level shifter 14, which may cause a through current to flow between a node N1 and a node N3 or between a node N2 and a node N4.

In contrast, in the present embodiment, as described with reference to FIG. 2 and other figures, the first power supply voltage VL is output as the second power supply voltage VM when the third power supply voltage VH is lower than the threshold voltage Vth, whereas the regulated voltage VR is output as the second power supply voltage VM when the third power supply voltage VH is higher than or equal to the threshold voltage Vth.

This can prevent the output voltages of the first level shifter 12 of FIG. 6 from having undefined values. As a result, in the circuit device of FIG. 6, it is possible to prevent the through current from flowing between the node N1 and the node N3 or between the node N2 and the node N4.

3. Display Device

Figure 7:
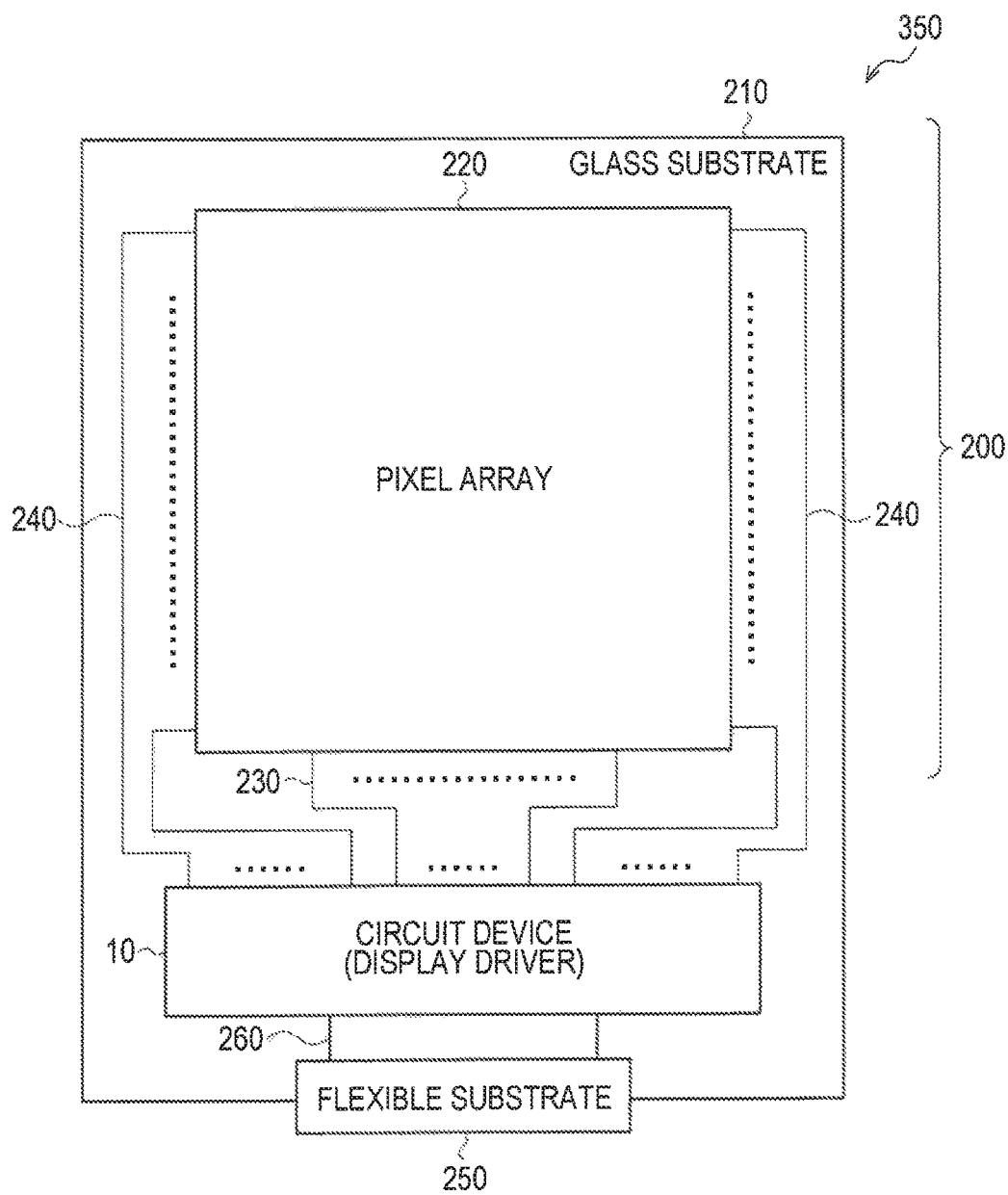
FIG. 7 is a view illustrating a configuration example of a display device of the present embodiment.

The circuit device 10 of the present embodiment is applicable to, for example, a display device (electro-optical device) 350 as shown in FIG. 7. The display device 350 includes the circuit device (display driver) 10 and the electro-optical panel 200. A description is hereinafter given of an example in which the display panel 200 is a matrix type liquid crystal display panel, but the display panel 200 may be an electro-luminescence (EL) display panel, or the like, including a self-light-emitting device.

The electro-optical device 350 includes: a glass substrate 210; a pixel array 220 formed on the glass substrate 210; the circuit device 10 mounted on the glass substrate 210; a wiring group 230 connecting the circuit device 10 to data lines of the pixel array 220; a wiring group 240 connecting the circuit device 10 to scanning lines of the pixel array 220; a flexible substrate 250 connected to a display controller 300; and a wiring group 260 connecting the flexible substrate 250 to the circuit device 10.

The wiring group 230, the wiring group 240, and the wiring group 260 are formed as transparent electrodes (Indium Tin Oxide: ITO) on the glass substrate 210.

The pixel array 220 includes pixels, the data lines, and the scanning lines, and the glass substrate 210 and the pixel array 220 correspond to the display panel 200.

Note that the electro-optical device may further include a substrate connected to the flexible substrate 250 and the display controller 300 mounted on the substrate.

4. Electronic Apparatus

Figure 8:
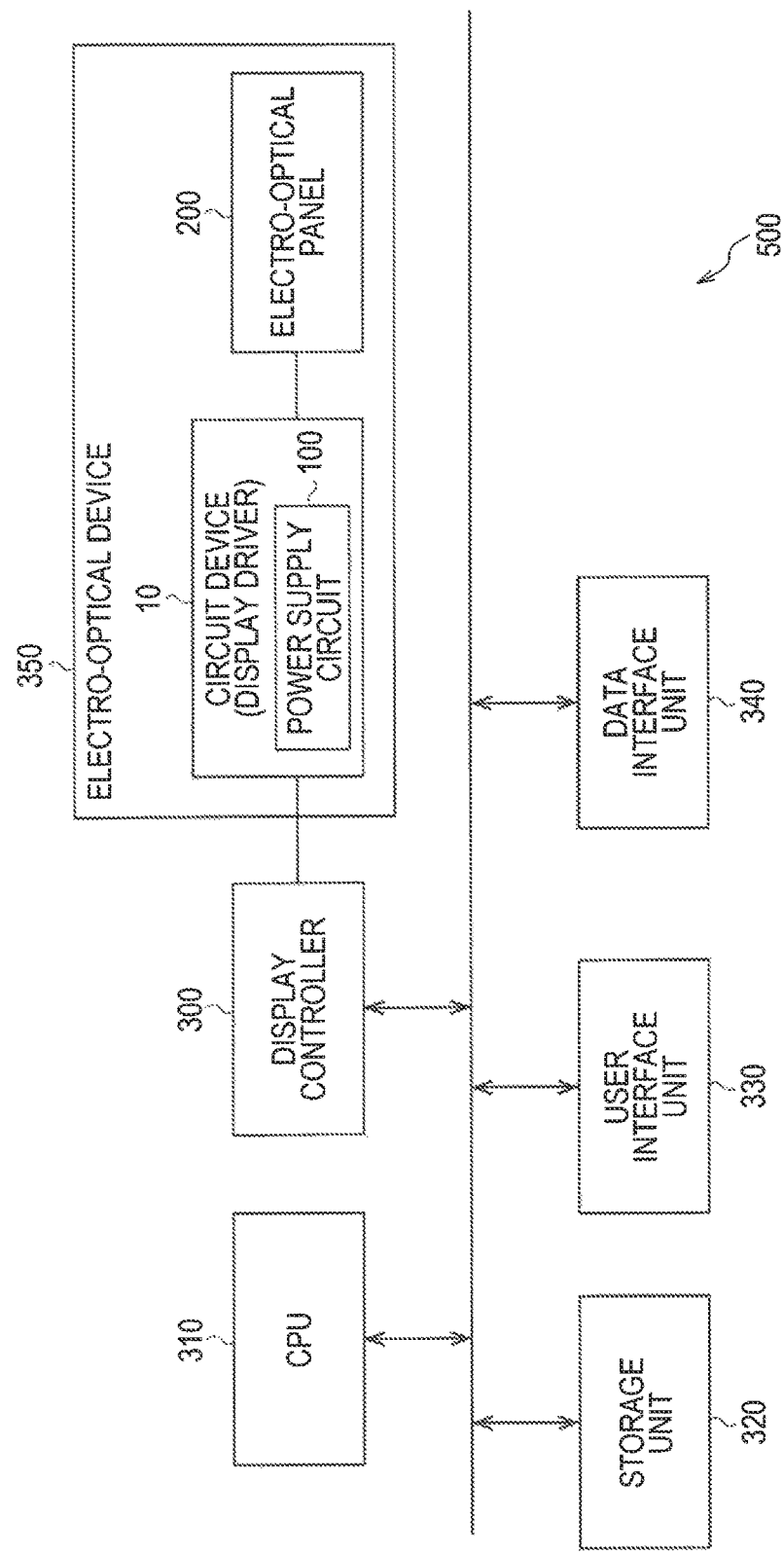
FIG. 8 is a view illustrating an example of a system configuration of an electronic apparatus of the present embodiment.

FIG. 8 shows a configuration example of the electro-optical device 350 to which the circuit device 10 of the present embodiment is applicable and an electronic apparatus 500. Examples of the electronic apparatus 500 of the present embodiment include various electronic apparatuses 500, such as on-vehicle display devices (for example, meter panels, etc.), monitors, displays, single-plate projectors, television sets, information processing devices (computers), mobile information terminals, car navigation systems, handheld game consoles, digital light processing (DLP) devices, printers, and the like, which include display devices.

The electronic apparatus 500 shown in FIG. 8 includes the electro-optical device 350, a CPU 310 (processing device in a broad sense), the display controller 300 (host controller), a storage unit 320, a user interface unit 330, and a data interface unit 340. Note that when the function of the display controller 300 is provided by the CPU 310, the display controller 300 may be omitted.

The user interface unit 330 is an interface unit which receives various operations performed by a user. For example, the user interface unit 330 is configured as a button, a mouse, a keyboard, a touch panel provided on the display panel 200, or the like. The data interface unit 340 is an interface unit for inputting/outputting of display data and control data. The data interface unit 340 is a wired communication interface, for example, a USB, or the like, or a wireless communication interface, for example, a wireless LAN, or the like. The storage unit 320 stores the display data input from the data interface unit 340. Alternatively, the storage unit 320 functions as a working memory of the CPU 310 or the display controller 300. The CPU 310 performs control processing of each component of the electronic apparatus 500 and various types of data processing. The display controller 300 performs control processing of the circuit device 10. For example, the display controller 300 converts display data transferred from the data interface unit 340 or the storage unit 320 via the CPU 310 into a format acceptable by the circuit device 10, and the display controller 300 outputs the converted display data to the circuit device 10. The circuit device 10 drives the display panel 200 based on the display data transferred from the display controller 300.

Figure 9:
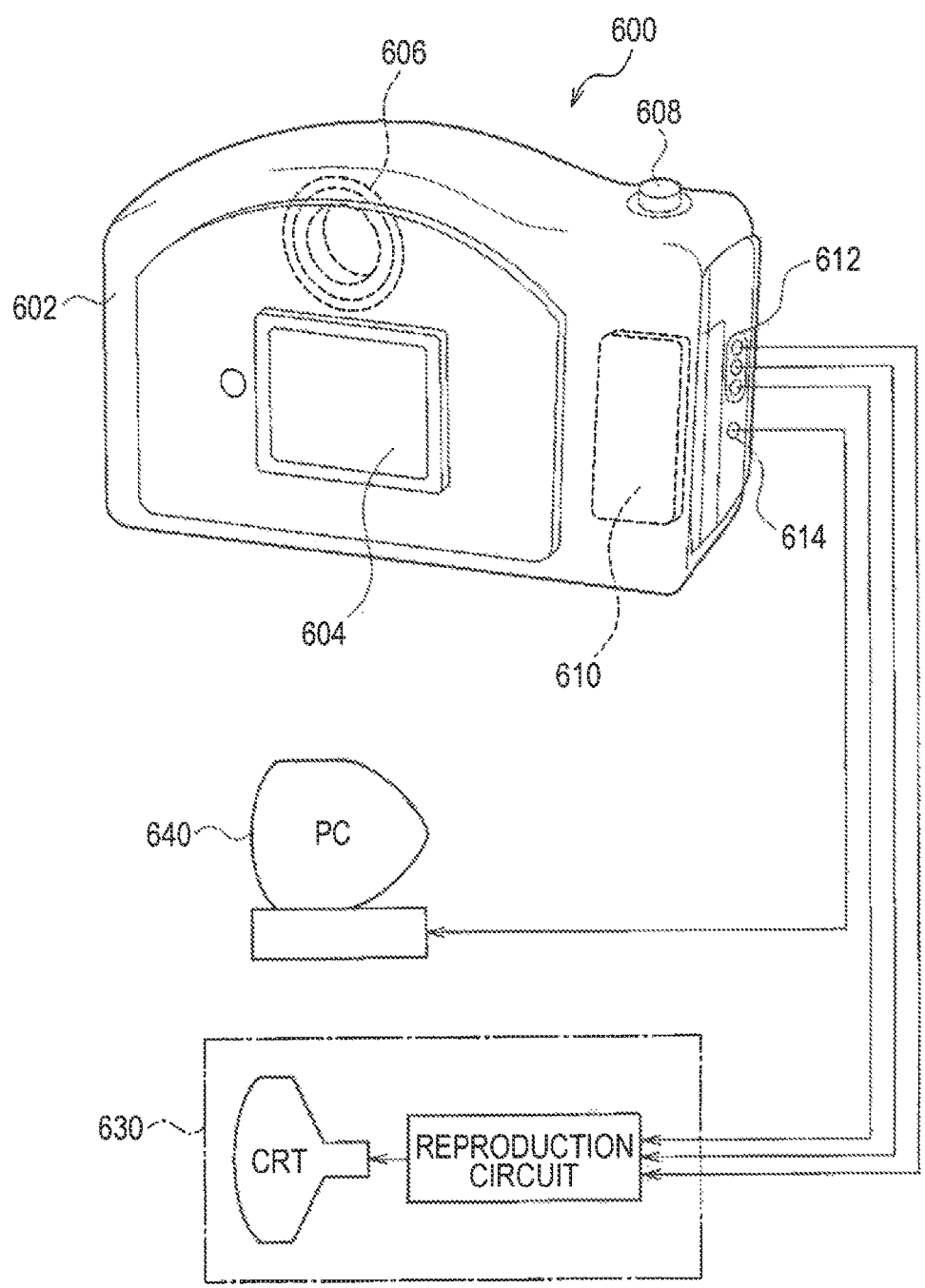
FIG. 9 is a view illustrating an example of the electronic apparatus.
Figure 10:
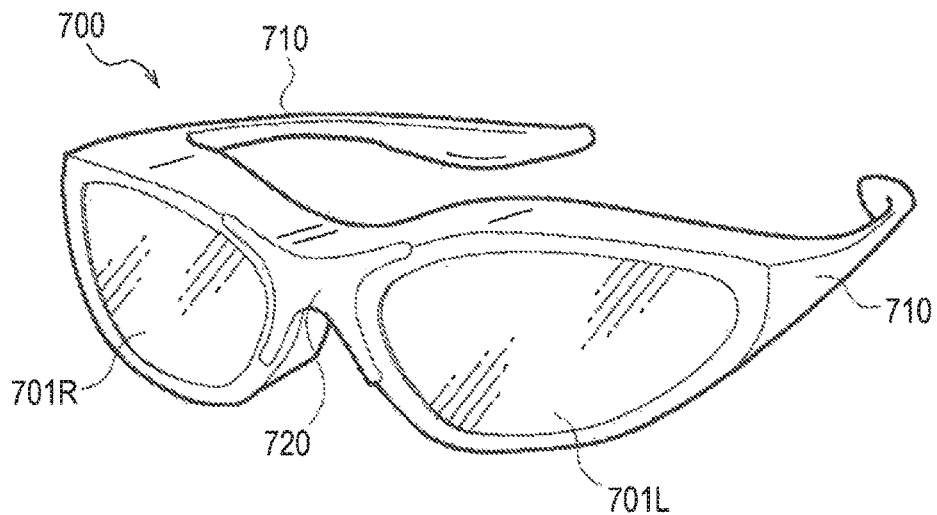
FIG. 10 is a view illustrating an example of the electronic apparatus.
Figure 11:
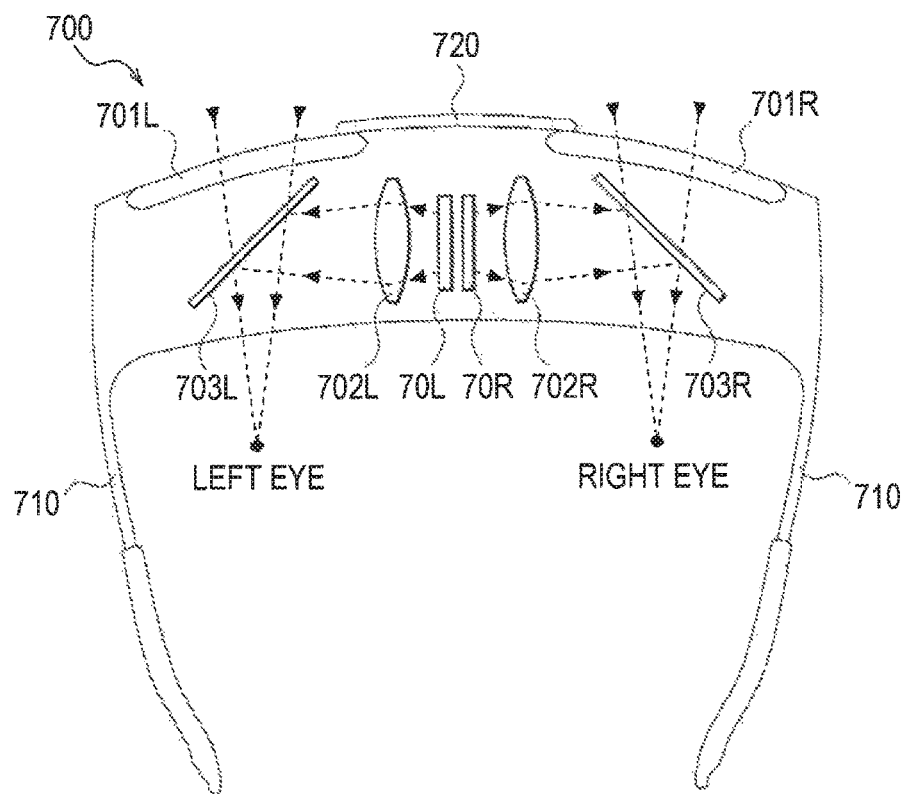
FIG. 11 is another view illustrating the example of FIG. 10.

More specific examples of the electronic apparatus are illustrated in FIGS. 9 to 11. FIG. 9 is a perspective view illustrating a configuration of a digital still camera 600 which is an example of the electronic apparatus, and this perspective view also simply shows a connection to external apparatuses. The digital still camera 600 includes a case 602 having a rear surface provided with a display device 604 that is an organic EL display device. The display device 604 is configured to display an image based on an imaging signal by a charge coupled device (CCD). Thus, the display device 604 serves as an electronic viewfinder for displaying an object. The case 602 has an observation side (a back surface side in the figure) provided with a light reception unit 606 including an optical lens, the CCD, and other components.

Here, when a photographer checks the object image displayed on the display device 604 and presses a shutter button 608, an imaging signal of the CCD at that time is transferred to and stored in a memory of the circuit substrate 610.

In the digital still camera 600, the case 602 has a side face provided with a video signal output terminal 612 and an input/output terminal 614 for data communication. If necessary, a television monitor 630 is connected to the video signal output terminal 612, and a personal computer 640 is connected to the input/output terminal 614 for data communication. Moreover, through prescribed manipulation, the image signal stored in the memory of the circuit substrate 610 is output to the television monitor 630 and/or the personal computer 640.

Moreover, FIGS. 10 and 11 show a head mount display 700 which is an example of the electronic apparatus. The head mount display 700 includes temples 710, a bridge 720, and lenses 701L and 701R similarly to glasses. Inside the bridge 720, a display device 70L for a left eye and a display device 70R for a right eye are provided. As these display devices 70L and 70R, the display device of the present embodiment is applicable.

An image displayed on the display devices 70L and 70R enters both of the eyes via optical lenses 702L and 702R and half mirrors 703L and 703R. An image for a left eye and an image for a right eye with disparity enable 3D display. Note that the half mirrors 703L and 703R transmit external light and thus do not obstruct the vision of a person who wears the head mount display.

While this embodiment has been described in detail above, it will be easily understood by those skilled in the art that a number of modifications can be made to the embodiment without substantially departing from new matters and advantages of the invention. Therefore, it is to be noted that these modifications are all included in the scope of the invention. For example, terms referred as broader or equivalent terms at least once in the specification and drawings can be replaced with the broader or equivalent terms in any part of the specification and drawings. Moreover, the configuration and operations of the power supply circuit, the circuit device, the display device, the electronic apparatus, and the like are not limited to what have been described in the embodiment, and various modifications can be made thereto.

The entire disclosure of Japanese Patent Application No. 2016-123369, Jun. 22, 2016 is expressly incorporated by reference herein.

What is claimed is:

1. A power supply circuit comprising:
   a regulator configured to receive a first power supply voltage and a third power supply voltage higher than the first power supply voltage and output a regulated voltage between the first power supply voltage and the third power supply voltage based on the third power supply voltage; and
   an output control circuit configured to select the first power supply voltage or the regulated voltage to output as a second power supply voltage, wherein
   the output control circuit outputs the first power supply voltage as the second power supply voltage when the third power supply voltage is lower than a threshold voltage, whereas the output control circuit outputs the regulated voltage as the second power supply voltage when the third power supply voltage is higher than or equal to the threshold voltage.

2. The power supply circuit according to claim 1, wherein the threshold voltage is a voltage between the regulated voltage and the third power supply voltage.

3. The power supply circuit according to claim 1, wherein the output control circuit includes:
   a determination circuit configured to determine whether or not the third power supply voltage is higher than or equal to the threshold voltage; and
   a selector configured to output the second power supply voltage, and
the selector outputs the first power supply voltage as the second power supply voltage when the determination circuit determines that the third power supply voltage is lower than the threshold voltage, whereas the selector outputs the regulated voltage as the second power supply voltage when the determination circuit determines that the third power supply voltage is higher than the threshold voltage.

4. The power supply circuit according to claim 3, wherein the determination circuit includes a comparator configured to compare a divided voltage obtained by dividing the third power supply voltage with the first power supply voltage.

5. The power supply circuit according to claim 3, wherein the selector includes:
   a PMOS transistor disposed between a node of the first power supply voltage and a node of the second power supply voltage; and
   an NMOS transistor disposed between an output node of the regulator and the node of the second power supply voltage.

6. The power supply circuit according to claim 1, wherein the regulator includes:
   an operational amplifier including a first input terminal, a second input terminal, and an output terminal;
   a first resistor disposed between the second input terminal and the output terminal; and
   a second resistor disposed between the first resistor and a node of a fourth power supply voltage lower than the first power supply voltage, and
the operational amplifier is supplied with the third power supply voltage, a voltage obtained by dividing the regulated voltage by the first resistor and the second resistor is input to the second input terminal, the first power supply voltage is input to the first input terminal, and the operational amplifier outputs the regulated voltage from the output terminal.

7. The power supply circuit according to claim 1, wherein the second power supply voltage is a power supply voltage supplied to a first level shifter configured to perform a level shift of an input signal based on the first power supply voltage, and
the third power supply voltage is a power supply voltage supplied to a second level shifter configured to perform a level shift of an output signal from the first level shifter.

8. The power supply circuit according to claim 7, wherein the first level shifter and the second level shifter are level shifters each configured to perform a level shift of each of a plurality of signals used in a drive circuit configured to drive a data line or a scanning line of an electro-optical panel.

9. A circuit device comprising:
the power supply circuit according to claim 1;
   a first level shifter to which the second power supply voltage is supplied and which is configured to perform a level shift of an input signal based on the first power supply voltage; and
   a second level shifter to which the third power supply voltage is supplied and which is configured to perform a level shift of an output signal from the first level shifter.

10. A display device comprising:
the circuit device according to claim 9; and
an electro-optical panel.

11. An electronic apparatus comprising:
the power supply circuit according to claim 1.

12. A circuit device comprising:
the power supply circuit according to claim 2;
   a first level shifter to which the second power supply voltage is supplied and which is configured to perform a level shift of an input signal based on the first power supply voltage; and
   a second level shifter to which the third power supply voltage is supplied and which is configured to perform a level shift of an output signal from the first level shifter.

13. A circuit device comprising:
the power supply circuit according to claim 3;
   a first level shifter to which the second power supply voltage is supplied and which is configured to perform a level shift of an input signal based on the first power supply voltage; and
   a second level shifter to which the third power supply voltage is supplied and which is configured to perform a level shift of an output signal from the first level shifter.

14. A circuit device comprising:
the power supply circuit according to claim 4;
   a first level shifter to which the second power supply voltage is supplied and which is configured to perform a level shift of an input signal based on the first power supply voltage; and
   a second level shifter to which the third power supply voltage is supplied and which is configured to perform a level shift of an output signal from the first level shifter.

15. A circuit device comprising:
the power supply circuit according to claim 5;
   a first level shifter to which the second power supply voltage is supplied and which is configured to perform a level shift of an input signal based on the first power supply voltage; and
   a second level shifter to which the third power supply voltage is supplied and which is configured to perform a level shift of an output signal from the first level shifter.

16. A circuit device comprising:
the power supply circuit according to claim 6;
   a first level shifter to which the second power supply voltage is supplied and which is configured to perform a level shift of an input signal based on the first power supply voltage; and
   a second level shifter to which the third power supply voltage is supplied and which is configured to perform a level shift of an output signal from the first level shifter.

17. A circuit device comprising:
the power supply circuit according to claim 7;

a first level shifter to which the second power supply voltage is supplied and which is configured to perform a level shift of an input signal based on the first power supply voltage; and a second level shifter to which the third power supply voltage is supplied and which is configured to perform a level shift of an output signal from the first level shifter.

18. A circuit device comprising:

the power supply circuit according to claim 8;

a first level shifter to which the second power supply voltage is supplied and which is configured to perform a level shift of an input signal based on the first power supply voltage; and a second level shifter to which the third power supply voltage is supplied and which is configured to perform a level shift of an output signal from the first level shifter.

* * * * *